United States Patent [19]

Thomas

[11] Patent Number: 4,556,825
[45] Date of Patent: Dec. 3, 1985

[54] SWITCHING CIRCUIT
[75] Inventor: Christopher L. Thomas, Harvest, Ala.
[73] Assignee: Intergraph Corporation, Huntsville, Ala.
[21] Appl. No.: 531,271
[22] Filed: Sep. 9, 1983
[51] Int. Cl.$^4$ ............................................... H01J 29/70
[52] U.S. Cl. .................................. 315/408; 330/207 P
[58] Field of Search ....................... 315/397, 408, 396; 330/207 P, 51; 361/131, 100, 107, 88, 91

[56] References Cited
U.S. PATENT DOCUMENTS
4,205,259 5/1980 Schindler ........................... 315/408
4,375,074 2/1983 Glogolja ................................ 361/91

Primary Examiner—Theodore M. Blum
Assistant Examiner—Gregory C. Issing

[57] ABSTRACT

A deflection circuit for a television includes two semiconductor switching elements connected in series. Separate control circuits are provided for each semiconductor switching element to control the operation of the respective switching element. Each control circuit receives a control signal and is connected to a voltage source. For the control circuit associated with the switching element which receives the highest voltage, connection to the voltage source and the control signal is through diodes which provide common mode isolation. This control circuit includes a capacitor which provides energy for the control circuit when the diode connecting it to the voltage source is reverse biased.

17 Claims, 5 Drawing Figures

SWITCHING CIRCUIT

BACKGROUND OF THE INVENTION

1. Field of the Invention

The present invention relates to switching circuits suitable for use in the deflection circuitry associated with cathode ray tubes. More particularly, the present invention relates to such circuits which include two semiconductor switching elements connected in series for switching large voltages.

2. Description of the Prior Art

Electron beams generated in cathode ray tubes are controlled by magnetic fields within the tube which deflect the beam. Typically, coils are employed to create the magnetic fields.

In many cathode ray tube applications, including televisions and oscilloscopes, the electron beam sweeps across the screen at a constant speed. This is accomplished by passing a linearly increasing current through one of the deflection coils. A simplified circuit for accomplishing this result is illustrated in FIG. 1. Deflection coil 10 is connected in a circuit with capacitor 12 and voltage source 14. Switch 16 is connected in parallel with capacitor 12.

FIG. 2 illustrates the waveform of the current passing through coil 10, and FIG. 3 illustrates the voltage across capacitor 12. If voltage source 14 is energized with switch 16 closed, current will flow through coil 10 in the direction of arrow 18 and will increase as shown in FIG. 2 between times a and b. At some appropriate point (time b), switch 16 is opened which causes current to flow through capacitor 12 instead of switch 16, thus charging capacitor 12. As soon as current begins to flow through capacitor 12, the magnitude of the current decreases (from time b to time c), charging capacitor 12. Then, the energy stored in capacitor 12 causes current to begin flowing in a direction opposite to arrow 18 (from time c to time d). This current reaches a peak in the opposite direction at time d when the energy in capacitor 12 is completely exhausted. At some point, switch 16 is closed and the cyle repeats itself.

As the current through coil 10 ramps up between times d and e, the electron beam sweeps across the screen. As the current ramps down, between times b and d and times e and f, the beam retraces back to its original position.

When switch 16 is opened while the current flowing through coil 10 is at a maximum, a large voltage develops across capacitor 12 as illustrated in FIG. 3. Of course, in practice, switch 16 is not mechanical but a semiconductor switching device. A problem arises in that the maximum voltage that is applied across capacitor 12, and thus switch 16, may exceed 1,000 volts. In their present stage of development, this is an unusually high voltage for semiconductor switching elements to handle.

To relieve this problem, two semiconductor switching elements have been connected in series. Thus, each semiconductor switching element need only handle approximately 500 volts, greatly reducing the expense and increasing the availability of the switching element.

A problem arises, however, in biasing the two semiconductor switching elements. Typically, the voltage difference between the control terminal and an appropriate one of the power terminals of the semiconductor switching element determines whether the element is conductive or not. When the switching elements are rendered nonconductive, the appropriate power terminal of one of the switching elements will rise up to 500 volts while the appropriate power terminal of the other switching element will remain close to zero volts. If a zero volt control signal is applied to both switching elements to render them nonconductive, the potential across the control terminal and the appropriate power terminal of one of the switching elements may reach or exceed 500 volts, which may destroy the switching element.

To overcome this problem, several approaches have been employed in the past. For example, transformers have been utilized to provide common mode isolation to prevent excessive voltages from developing across the terminals of a switching element. Thus, the primary of the transformer receives the control signal and the secondary of the transformer is connected across the control terminal and the appropriate power terminal of the switching element. When the voltage on the power terminal rises, the voltage on the control terminal also rises to the same level plus the voltage generated by the secondary.

However, problems exist with the use of a transformer or any other magnetic circuitry. Magnetic circuitry does not function well at high frequencies. For some cathode ray tube applications, the frequency of the control signal may be so high that transformers may not function efficiently. Furthermore, transformers tend to be bulky, heat generating devices which may not be suitable for some applications.

Another approach has employed optical drivers to provide a high level of isolation. Although an optical system can provide the isolation, at the present state of development, optical drivers are slow, operating in the microsecond range. In some cathode ray tube applications, the entire horizontal sweep must be accomplished in 12 microseconds and the retrace must occur in 3.5 microseconds. Therefore, the semiconductor switching elements must be switched on the order of 50 to 100 nanoseconds. Optical drivers simply cannot respond at this speed.

SUMMARY OF THE INVENTION

The present invention overcomes these problems by providing common mode isolation in an inexpensive, highly effective manner. The preferred embodiment of the present invention relates to cathode ray tube deflection circuitry. In the preferred embodiment, switching is performed by a pair of semiconductor switching elements having power terminals connected in series. A control circuit is provided for each switching element for operating the associated switching element in response to a control signal. For the switching element which floats above ground, a semiconductor blocking element is provided for passing the control signal to the associated control circuit and for preventing voltages larger than a predetermined value from passing from the control circuit back to the source of the control signal. In this manner, the voltage of the entire control circuit rides up with the voltage of the associated switching element so that the only element subjected to large voltage differentials is the blocking element. The blocking element may be a diode. Many commercially available, relatively inexpensive diodes can handle a reverse bias of 500 volts.

A second blocking element may also be provided between the voltage source for the affected control circuit and the control circuit itself. Again, the second blocking means may be a diode.

When the blocking element between the voltage source and the control circuit is reverse biased, no energy can flow from the voltage source to the control circuit. Therefore, in the preferred embodiment, the control circuit includes as energy storing device which is charged when the blocking element is forward biased and which provides energy for the control circuit when the blocking element is reverse biased.

With this arrangement, the switching circuit of the present invention can control the voltage across a capacitor connected in series with the deflection coil. Since a semiconductor blocking element is employed, the semiconductor switching elements can be switched rapidly with a circuit of minimal cost and bulk.

The preferred embodiment of the present invention is directed to deflection circuits for cathode ray tubes. However, the present invention has applicability to any switching situation. The present invention is particularly useful for switching high voltages, particularly in circuits having large inductive loads.

BRIEF DESCRIPTION OF THE DRAWING

These and other objects and advantages of this invention will become more apparent and more readily appreciated from the following detailed description of the presently preferred exemplary embodiment of the invention taken in conjunction with the accompanying drawing, of which.

DETAILED DESCRIPTION OF THE PRESENTLY PREFERRED EXEMPLARY EMBODIMENT

Figure 4:
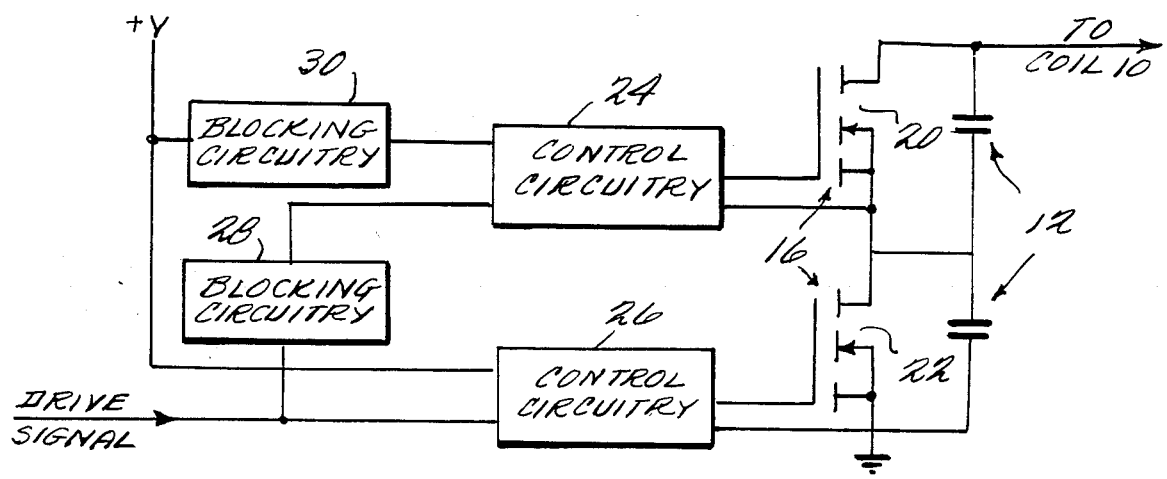
FIG. 4 is a block diagram of the preferred embodiment of the present invention.

As illustrated in FIG. 4, semiconductor switching elements, such as MOSFETs 20 and 22 have power terminals connected in series between ground and coil 10. Switching elements 20 and 22 are controlled by control circuitry 24 and 26, respectively. A drive signal is applied to control circuitry 26 to render switching element 22 either conductive or nonconductive. The drive signal is also applied to control circuit 24 through blocking circuitry 28.

Control circuit 26 receives power from a voltage source. Control circuit 24 also receives power from the voltage source through blocking circuitry 30.

In FIG. 4, capacitor 12 is divided into two individual capacitors with the point between the capacitors being connected to the point of interconnection between switching elements 20 and 22. With this arrangement, the voltage across switching elements 20 and 22 will be divided equally.

In operation, a drive signal causes switching elements 20 and 22 to be conductive, causing current to flow through coil 10. At some point, the drive signal causes switching elements 20 and 22 to become nonconductive. To accomplish this, the voltage applied to the gates of transistors 20 and 22 must be no more than the voltage applied to the sources of these transistors.

When switching elements 20 and 22 are rendered nonconductive, the voltage across capacitor 12 rises rapidly. Therefore, the voltage across switching elements 20 and 22 also rises rapidly. Since switching element 22 has its source grounded, the gate of switching element 20 need only remain near ground so as to maintain switching element 22 nonconductive. However, the voltage on the source of switching element 20 will rise to approximately half the voltage value across capacitors 12. If the gate of switching element 20 were maintained near ground, the voltage across the source and the gate may destroy switching element 20. Therefore, the voltage of control circuitry 24 is also allowed to rise with the voltage on the source of switching element 20. Blocking circuits 28 and 30 prevent this voltage from affecting the voltage source and the source of the drive signals. In this manner, the voltage on the gate of switching element 20 may rise up with the voltage on the source, thus preserving the integrity of switching element 20.

Figure 5:
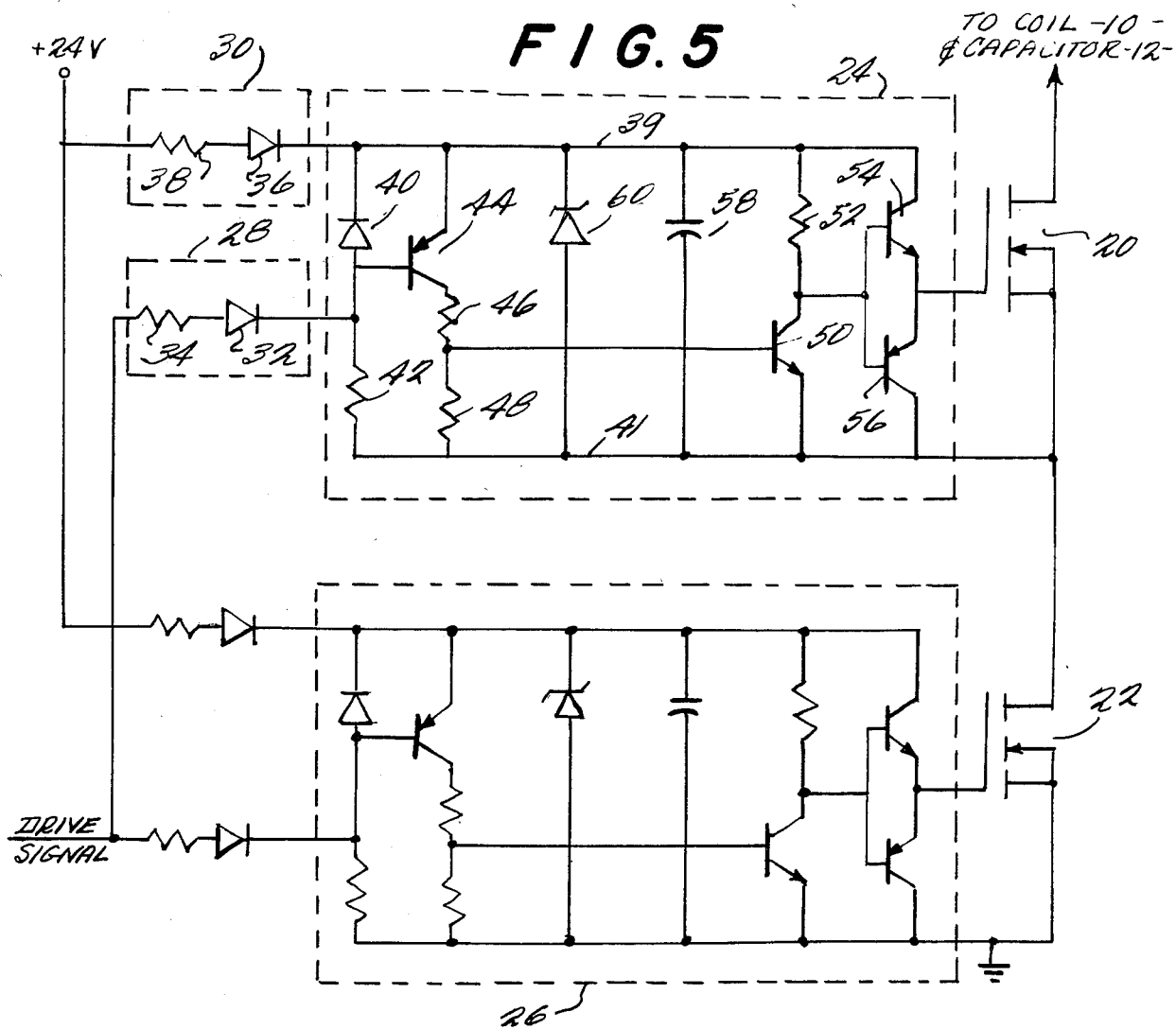
FIG. 5 is a detailed circuit diagram of the preferred embodiment of the present invention.

FIG. 5 illustrates the details of the circuitry of FIG. 4. Thus, blocking circuitry 28 includes diode 32 and resistor 34. Blocking circuitry 30 includes diode 36 and resistor 38. Drive signals through blocking circuitry 28 are biased by diode 40 and resistor 42 connected in series between line 39 from a 24 volt voltage source and line 41. The biased drive signals are applied to the base of transistor 44 having power terminals connected in series with resistors 46 and 48 between line 39 and line 41. The output of transistor 44, taken between resistors 46 and 48, is applied to transistor 50 which is connected in series with resistor 52 between line 39 and line 41. NPN transistor 54 and PNP transistor 56 have power terminals connected in series between line 39 and line 41. The bases of these transistors are connected to the output of transistor 50. The gate of switching element 20 is connected to the emitters of transistors 54 and 56, while the collector of transistor 56 is connected to the source of switching element 20. Capacitor 58 and 14 volt Zener diode 60 are connected in parallel between line 39 and line 41.

Control circuitry 26 is identical to control circuitry 24, and thus will not be described in detail.

In operation, a high drive signal passes through blocking circuitry 28 and is applied to the base of transistor 44. This causes transistor 44 to be biased off. As a result, the base and emitter of transistor 50 have the same voltage applied to them so that transistor 50 is biased off, rendering the collector of transistor 50 at a high voltage regulated by Zener diode 60. This high voltage, applied to the bases of transistors 54 and 56, renders transistor 54 conductive and transistor 56 nonconductive. Therefore, a positive voltage is applied between the gate and source of MOSFET 20, rendering MOSFET 20 conductive. Similarly, the high drive signal causes MOSFET 22 to be conductive. When MOSFET 20 is conductive, current flows from the 24 volt source through blocking circuitry 30 to charge capacitor 58 to the 14 volts permitted by Zener diode 60.

When a low drive signal is generated, it causes the base of transistor 44 to become low, thus rendering transistor 44 conductive. As a result, the voltage on the base of transistor 50 becomes high, rendering transistor 50 conductive. This causes the voltage on the collector of transistor 50 to become low. As a result, transistor 54 becomes nonconductive and transistor 56 becomes conductive. Therefore, the voltage across the gate and source of MOSFET 20 becomes very small, rendering MOSFET 20 nonconductive. Similarly, MOSFET 22 also becomes nonconductive.

Figure 1:
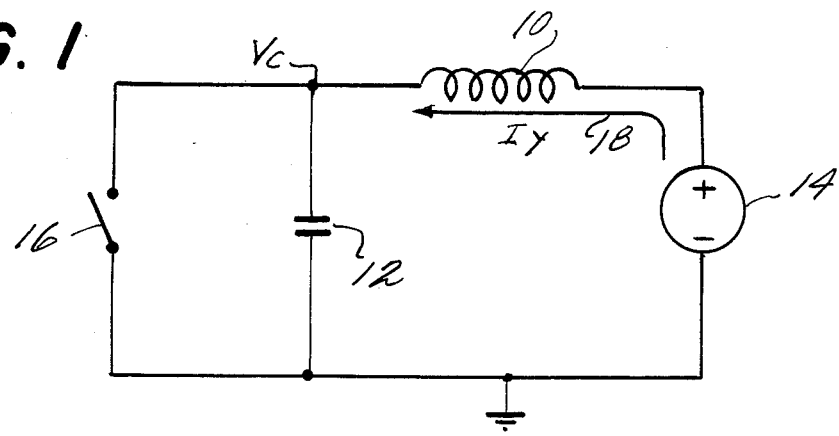
FIG. 1 is a simplified schematic illustration of a cathode ray tube deflection circuit.
Figure 2:
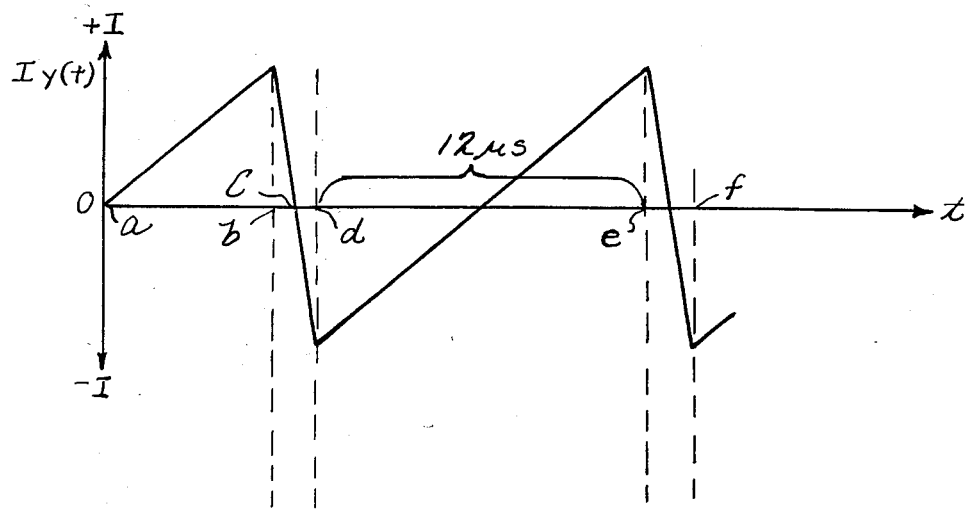
FIG. 2 is a waveform of the current flowing through the deflection coil in FIG. 1.
Figure 3:
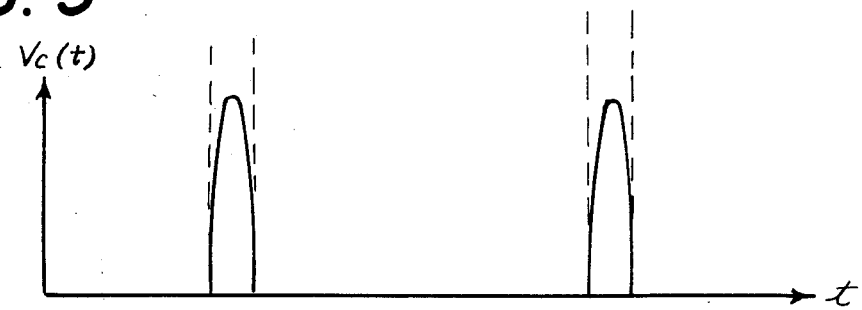
FIG. 3 is a waveform of the voltage appearing across the capacitor in the circuit of FIG. 1.

As a result, as illustrated in FIG. 3, the voltage across switching elements 20 and 22 rises rapidly. Therefore, the voltage at the source of MOSFET 20 rises to approximately half the maximum value across switching elements 20 and 22. Obviously, then, line 41 also rises to this high voltage, causing diodes 32 and 36 to become reverse biased, preventing the high voltage from reaching the 24 volt supply or the source of the drive signals.

Since diode 36 is reverse biased, no energy can flow from the 24 volt source to maintain transistors 44 and 50 conductive. However, capacitor 58 has been charged to 14 volts. This energy is employed to maintain transistors 44 and 50 conductive, and therefore switching element 20 nonconductive.

Eventually, the drive signal again becomes high. Therefore, diodes 32 and 36 again become forward biased. The drive signal must remain high long enough to charge capacitor 58.

Although the preferred embodiment of the present invention is shown utilized in a deflection circuit for a cathode ray tube, the present invention may be employed to perform any switching function. However, the present invention is particularly useful for switching high voltages, particularly when an inductive load is connected to the switching circuit.

Although only a single preferred embodiment has been described in detail above, those skilled in the art will readily appreciate that minor modifications can be made in the preferred embodiment without materially departing from the novel teachings and advantages of this invention. Accordingly, all such modifications are intended to be included within the scope of this invention as defined in the following claims.

What is claimed is:

1. A deflection circuit for a television comprising:
   a deflection coil;
   means for energizing said coil;
   switch means, connected in a circuit with said coil and said energizing means for controlling the energization of said coil, said switching means including first and second semiconductor switching elements each having first and second power terminals, said second power terminal of said first semiconductor switching element being connected to said first power terminal of said second semiconductor switching element, each of said semiconductor switching elements also having a control terminal;
   first control means, coupled to said first switching element control terminal and responsive to a control signal, for operating said first switching element;
   second control means, coupled to said second switching element control terminal and responsive to said control signal, for operating said second switching element; and
   semiconductor blocking means, having an input and an output coupled to said first control means, for passing said control signal to said first control means and for allowing a voltage on said control terminal of said first semiconductor switching element to follow a voltage on said second terminal of said first semiconductor switching element above said control signal while preventing voltages larger than a predetermined value from passing from said output of said input.

2. A circuit as in claim 1 further comprising a capacitance connected in parallel with said switching means.

3. A circuit as in claim 1 wherein said semiconductor blocking means includes a diode having a cathode coupled to said first control means.

4. A circuit as in claim 1 further comprising another semiconductor blocking means, having an input adapted for connection to an energy source and an output coupled to said first control means, for passing energy from said energy source to said first control means and for allowing a voltage associated with said first control means to follow a voltage on said second terminal of said first semiconductor switching element above a voltage associated with said energy source while preventing energy from passing from said first control means to said energy source.

5. A circuit as in claim 4 wherein said another semiconductor blocking means includes a diode having a cathode connected to said first control means.

6. A circuit as in claim 1 wherein said first control means comprises:
   means, responsive to said control signal, for biasing said first semiconductor switching element conductive or nonconductive; and
   energy storage means for energizing said biasing means while said first semiconductor switching element is nonconductive.

7. A circuit as in claim 4 wherein said first control means comprises:
   means, responsive to said control signal, for biasing said first semiconductor switching element conductive and nonconductive; and
   energy storage means for providing energy to said biasing means when said another semiconductor blocking means prevents energy from flowing from said first control means to said energy source.

8. A switching circuit comprising:
   a first semiconductor switching element having first and second power terminals and a control terminal, said first terminal being adapted for connection to a first voltage source;
   a second semiconductor switching element having first and second power terminals and a control terminal, said second switching element first terminal being connected to said first switching element second terminal, said second switching element second terminal being adapted for connection to a second voltage source;
   first control means, coupled to said first switching element control terminal and responsive to a control signal, for operating said first switching element;
   second control means, coupled to said second switching element control terminal and responsive to said control signal, for operating said second switching element; and
   semiconductor blocking means, having an input and an output coupled to said first control means, for passing said control signal to said first control means and for allowing a voltage on said control terminal of said first semiconductor switching switching element to follow a voltage on said second terminal of said first semiconductor switching element above said control signal while preventing voltages larger than a predetermined value from passing from said output to said input.

9. A circuit as in claim 8 wherein said semiconductor blocking means includes a diode having a cathode connected to said first control means.

10. A circuit as in claim 8 further comprising another semiconductor blocking means, having an input adapted to be coupled to a third voltage source and an output coupled to said first control means, for providing power to said first control means and for allowing a voltage associated with said first control means to follow a voltage on said second terminal of said first semiconductor switching element above a voltage associated with said third voltage source while preventing power from passing from said first control means to said third voltage source.

11. A circuit as in claim 10 wherein said another semiconductor blocking means includes a diode having a cathode connected to said first control means.

12. A circuit as in claim 8 wherein said first control means each include:
   means, responsive to said control signal, for biasing said first semiconductor switching element conductive or nonconductive; and
   energy storage means, connected to said biasing means, for providing energy to said biasing means while said first semiconductor switching element is nonconductive.

13. A circuit as in claim 10 wherein said first control means includes:
   means, responsive to said control signal, for biasing said first semiconductor switching element conductive and nonconductive; and
   energy storage means for providing energy to said biasing means when said another semiconductor blocking means prevents energy from flowing from said first control means to said third voltage source.

14. A circuit as in claim 8 further comprising an inductive load connected in series with said first and second semiconductor switching elements.

15. A switching circuit comprising:
   a first semiconductor switching element having first and second power terminals and a control terminal, said first terminal being adapted for connection to a first voltage source;
   a second semiconductor switching element having first and second power terminals and a control terminal, said second switching element first terminal being coupled to said first switching element second terminal, said second switching element second terminal being adapted for connection to a second voltage source;
   biasing means, responsive to a control signal and coupled to said first switching element control terminal, for rendering said first semiconductor switching element conductive and nonconductive;
   a first diode having an anode responsive to said control signal and a cathode coupled to said biasing means to allow a voltage on said control terminal of said first switching element to follow a voltage on said second terminal of said first switching element above said control signal;
   a second diode having an anode adapted to be coupled to an energy source and a cathode coupled to said biasing means for providing energy to said biasing means to allow a voltage associated with said biasing means to follow a voltage on said second terminal of said first switching element above a voltage associated with said energy source;
   energy storage means for providing energy to said biasing means when said second diode is nonconductive; and
   a control circuit, coupled to said second switching element control terminal and responsive to said control signal, for operating said second switching element.

16. A circuit as in claim 15 further comprising an inductive load coupled in series with said first and second semiconductor switching elements.

17. A deflection circuit for a television comprising:
   a coil;
   means for energizing said coil;
   switching means connected in series with said coil and said energizing means, said switching means including first and second semiconductor switching elements each having first and second power terminals, said second terminal of said first switching element being connected to said first terminal of said second switching element, each of said first and second semiconductor switching elements having a control terminal;
   biasing means, responsive to a control signal and coupled to said first semiconductor switching element control terminal, for rendering said first semiconductor switching element conductive and nonconductive;
   a first diode having an anode responsive to said control signal and a cathode coupled to said biasing means to allow a voltage on said control terminal of said first switching element to follow a voltage on said second terminal of said first switching element above said control signal;
   a second diode having an anode adapted to be coupled to an energy source and a cathode coupled to said biasing means for energizing said biasing means to allow a voltage associated with said biasing means to follow a voltage on said second terminal of said first switching element above a voltage associated with said energy source;
   energy storage means for providing energy to said biasing means when no energy is flowing through said second diode; and
   control means, coupled to said second switching element control terminal and responsive to said control signal, for operating said second switching element.

* * * * *